United States Patent
Golov (10) Patent No.: US 12,087,386 B2
(45) Date of Patent: *Sep. 10, 2024

(54) PARALLEL ACCESS TO VOLATILE MEMORY BY A PROCESSING DEVICE FOR MACHINE LEARNING

(71) Applicant: Lodestar Licensing Group LLC, Evanston, IL (US)

(72) Inventor: Gil Golov, Backnang (DE)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/164,051

(22) Filed: Feb. 3, 2023

(65) Prior Publication Data

US 2023/0186957 A1    Jun. 15, 2023

Related U.S. Application Data

(63) Continuation of application No. 16/127,850, filed on Sep. 11, 2018, now Pat. No. 11,574,659.

(51) Int. Cl.
*G11C 7/10* (2006.01)
*G06N 3/02* (2006.01)
(Continued)

(52) U.S. Cl.
CPC ............... *G11C 7/10* (2013.01); *G06N 3/02* (2013.01); *G06N 3/04* (2013.01); *G06N 3/08* (2013.01); *G06N 20/00* (2019.01); *G11C 7/22* (2013.01)

(58) Field of Classification Search
CPC .......... G11C 7/10; G11C 7/22; G11C 7/1006; G11C 8/12; G11C 11/54; G06N 3/02; G06N 3/04; G06N 3/08; G06N 20/00; G06N 3/0454; G06N 3/063; G06N 3/084; G06F 13/1673; G06F 3/0644; G06F 3/0656; G06F 3/0683; G06F 12/0646
See application file for complete search history.

(56) References Cited

U.S. PATENT DOCUMENTS 11,574,659 B2    2/2023   Golov
2010/0262757 A1  10/2010  Sprinkle et al.
(Continued)

OTHER PUBLICATIONS

Jamie Hanlon, How to Solve the Memory Challenges of Deep Neural Networks, retrieved from https://www.topbots.com/how-solve-memory-challenges-deep-learning-neural-networks-graphcore/ on Sep. 10, 2018.

*Primary Examiner* — Ajay Ojha
(74) *Attorney, Agent, or Firm* — Greenberg Traurig (57) ABSTRACT

A memory system having a processing device (e.g., CPU) and memory regions (e.g., in a DRAM device) on the same chip or die. The memory regions store data used by the processing device during machine learning processing (e.g., using a neural network). One or more controllers are coupled to the memory regions and configured to: read data from a first memory region (e.g., a first bank), including reading first data from the first memory region, where the first data is for use by the processing device in processing associated with machine learning; and write data to a second memory region (e.g., a second bank), including writing second data to the second memory region. The reading of the first data and writing of the second data are performed in parallel.

20 Claims, 4 Drawing Sheets

(51) Int. Cl.
  *G06N 3/04*     (2023.01)
  *G06N 3/08*     (2023.01)
  *G06N 20/00*    (2019.01)
  *G11C 7/22*     (2006.01)

(56) References Cited

U.S. PATENT DOCUMENTS

| | | |
|---|---|---|
| 2011/0205824 A1* | 8/2011 | Kajigaya .............. G11C 7/1006 |
| | | 365/219 |
| 2014/0310576 A1 | 10/2014 | Asano et al. |
| 2019/0324748 A1 | 10/2019 | Fowers et al. |
| 2020/0082852 A1 | 3/2020 | Golov |

\* cited by examiner

PARALLEL ACCESS TO VOLATILE MEMORY BY A PROCESSING DEVICE FOR MACHINE LEARNING

RELATED APPLICATIONS

The present application is a continuation application of U.S. patent application Ser. No. 16/127,850, filed Sep. 11, 2018, issued as U.S. Pat. No. 11,574,659 on Feb. 7, 2023, the entire disclosure of which application is hereby incorporated herein by reference.

FIELD OF THE TECHNOLOGY

At least some embodiments disclosed herein relate to memory systems in general, and more particularly, parallel access to volatile memory for machine learning processing by a processing device.

BACKGROUND

Limited memory bandwidth is a significant problem in machine learning systems. For example, DRAM devices used in current systems store large amounts of weights and activations used in deep neural networks (DNNs).

Existing computer architectures use processor chips specialized for serial processing and DRAMs optimized for high density memory. The interface between these two devices is a major bottleneck that introduces latency and bandwidth limitations and adds a considerable overhead in power consumption. Memory on-chip is area expensive and it is not possible to add large amounts of memory to the CPU and GPU processors currently used to train and deploy DNNs.

Memory in neural networks is required to store input data, weight parameters and activations as an input propagates through the network. In training, activations from a forward pass must be retained until they can be used to calculate the error gradients in the backwards pass. As an example, a network can have 26 million weight parameters and compute 16 million activations in a forward pass. If a 32-bit floating-point value is used to store each weight and activation, this corresponds to a total storage requirement of 168 MB.

GPUs and other machines need significant memory for the weights and activations of a neural network. GPUs cannot efficiently execute directly the small convolutions used in deep neural networks, so they need significant activation or weight storage. Finally, memory is also required to store input data, temporary values and program instructions. For example, a high performance GPU may need over 7 GB of local DRAM.

Large amounts of storage data cannot be kept on the GPU processor. In many cases, high performance GPU processors have only 1 KB of memory associated with each of the processor cores that can be read fast enough to saturate the floating-point data path. Thus, at each layer of a DNN, the GPU needs to save the state to external DRAM, load up the next layer of the network, and then reload the data. As a result, the off-chip memory interface suffers the burden of constantly reloading weights and saving and retrieving activations. This significantly slows down training time and increases power consumption.

BRIEF DESCRIPTION OF THE DRAWINGS

The present disclosure will be understood more fully from the detailed description given below and from the accompanying drawings of various embodiments of the disclosure.

DETAILED DESCRIPTION

At least some aspects of the present disclosure are directed to parallel access to volatile memory by a processing device that is supporting processing for machine learning (e.g., a neural network).

Deep learning machines, such as those supporting processing for convolutional neural networks (CNNs), perform processing to determine a huge number of calculations per second. For example, input/output data, deep learning network training parameters, and intermediate results are constantly fetched from and stored in one or more memory devices (e.g., DRAM). A DRAM type of memory is typically used due to its cost advantages when large storage densities are involved (e.g., storage densities greater than 100 MB). In one example of a deep learning hardware system, a computational unit (e.g., a system-on-chip (SOC), FPGA, CPU, or GPU) is attached to a memory device(s) (e.g., a DRAM device).

It has been recognized that existing machine learning architectures (e.g., as used in a deep learning machine), in which a processing device reads and writes data to a memory device such as a DRAM during machine learning processing, suffer from various problems. For example, the memory data bandwidth is limited by the speed of the interface between the processor and the memory device. Also, significant memory data bandwidth is lost due to overhead for the read/write memory data bus turnaround. Additionally, a significant amount of power is consumed to deliver high-speed data to and from the memory device.

At least some aspects of the present disclosure address the above and other deficiencies by combining memory and processing resources in a single device. In one example, a processing device is integrated into a volatile memory device (e.g., DRAM). By combining memory and processing resources, the efficiency of processing when performing machine learning is increased. In one example, the machine learning uses one or more neural networks. In other examples, other types of computer models can be used.

In one embodiment, a processing device is added inside a volatile memory device (e.g., a DRAM device). The processing device can be, for example, a state machine, an arithmetic logic unit (ALU), CPU, graphics processing unit (GPU), field-programmable gate array (FPGA), etc. In various embodiments, the processing device is provided parallel access to memory regions in the memory device. For example, the memory regions are banks in a DRAM device. This structure has several advantages over existing structures.

For example, when the processing device is inside a DRAM device, the memory data bandwidth is not limited by a DRAM device interface to an external processing device, but instead by an internal bank access speed of the DRAM device, which is faster. The processing device can use the parallel access to multiple banks of the DRAM device to increase processing speed when doing machine learning processing.

In various embodiments using a DRAM device, each bank of the DRAM can operate in either a write mode or a read mode. Operating in a single mode increases efficiency of data transfer to or from each bank. Thus, any given single bank can work in a continuous burst mode and deliver its maximum data throughput without incurring a read/write bus turnaround penalty. This improves the overall system performance throughput. Also, the processing device can read/write data in parallel from/to multiple banks at the same time, and thus increase system data throughput. Finally, for example, due to the short distances on a silicon die between the processing device and the DRAM banks, only a small amount of power is used to deliver data between the processing device and the DRAM banks.

Figure 1:
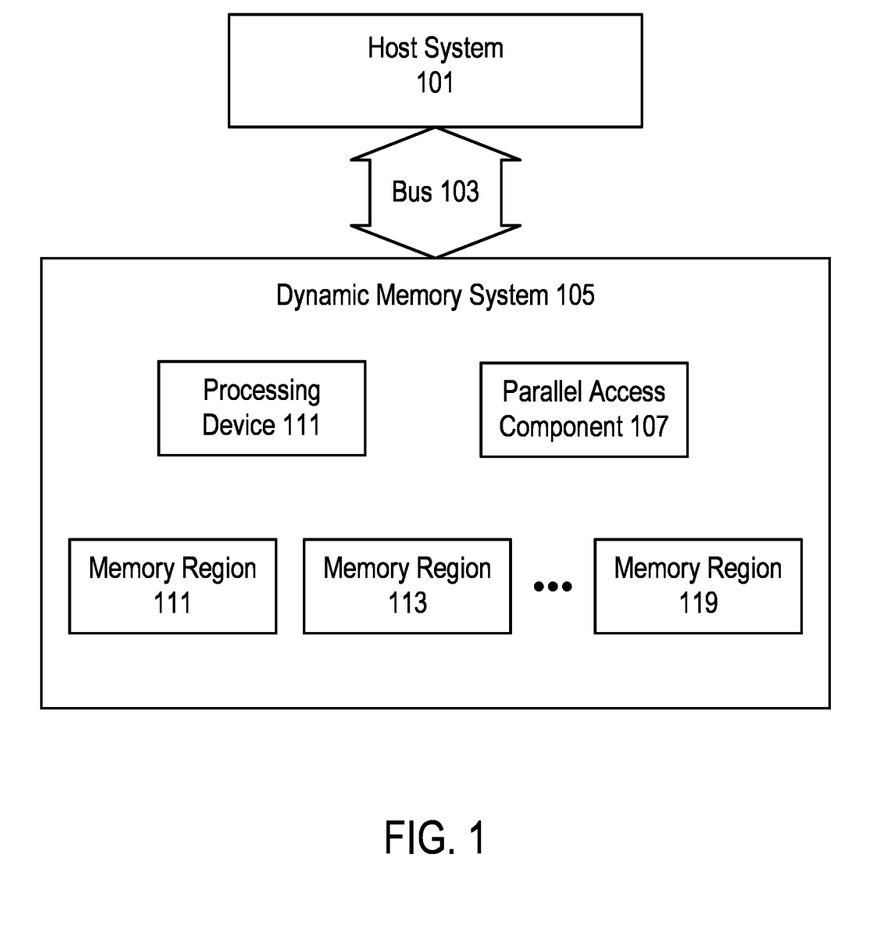
FIG. 1 illustrates an example memory system having a parallel access component, in accordance with some embodiments of the present disclosure.

FIG. 1 illustrates an example memory system having a parallel access component 107, in accordance with some embodiments of the present disclosure. A host system 101 communicates over a bus 103 with a dynamic memory system 105. A processing device 111 of memory system 105 has parallel read/write access to memory regions 111, 113, . . . , 119. In one example, the processing device 111 and the memory regions 111, 113, . . . , 119 are on the same chip or die. In various embodiments, the memory regions store data used by the processing device during machine learning processing.

In various embodiments, the parallel access component 107 includes one or more controllers coupled to each of the memory regions 111, 113, . . . , 119. The controllers are configured to read or write data to or from one or more of the memory regions. The read data is used by the processing device 111 in processing associated with machine learning. The written data can be, for example, an output from a neural network. In one embodiment, parallel access to the memory regions is provided to the processing device 111 in which data is read from one of the memory regions at the same time that data is written to another of the memory regions. Each of the memory regions can be operated in either a read-only mode or a write-only mode. Also, each of the memory regions additionally can be operated in a continuous burst mode.

In one example, each memory region 111, 113, . . . , 119 can include one or more banks of memory units; and the parallel access component 107 can provide parallel access to the banks. In one example, the memory units in the dynamic memory system 105 can be DRAM memory cells in a DRAM device.

An example of dynamic memory system 105 is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. In some embodiments, the memory system can be a hybrid memory/storage system that provides both memory functions and storage functions. In general, a host system can utilize a memory system that includes one or more memory regions. The host system can provide data to be stored at the memory system and can request data to be retrieved from the memory system. In one example, a host can access various types of memory, including volatile and non-volatile memory.

The host system 101 can be a computing device such as a controller in a vehicle, a network server, a mobile device, or any computing device that includes a memory and a processing device. The host system 101 can include or be coupled to the dynamic memory system 105 so that the host system 101 can read data from or write data to the memory system 105. The host system 101 can be coupled to the memory system 105 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, etc. The physical host interface can be used to transmit data between the host system 101 and the memory system 105. The physical host interface can provide an interface for passing control, address, data, and other signals between the memory system 105 and the host system 101. FIG. 1 illustrates a memory system 105 as an example. In general, the host system 101 can access multiple memory systems via a same communication connection, multiple separate communication connections, and/or a combination of communication connections.

The host system 101 can include a processing device and a controller. The processing device of the host system 101 can be, for example, a microprocessor, a central processing unit (CPU), a processing core of a processor, an execution unit, etc. In some instances, the controller of the host system can be referred to as a memory controller, a memory management unit, and/or an initiator. In one example, the controller controls the communications over bus 103 between the host system 101 and the memory system 105.

A controller of the host system 101 can communicate with a controller of the memory system 105 to perform operations such as reading data, writing data, or erasing data at the memory regions. In some instances, the controller is integrated within the same package of the processing device 111. In other instances, the controller is separate from the package of the processing device 111. The controller and/or the processing device can include hardware such as one or more integrated circuits and/or discrete components, a buffer memory, a cache memory, or a combination thereof. The controller and/or the processing device can be a microcontroller, special purpose logic circuitry (e.g., a field programmable gate array (FPGA), an application specific integrated circuit (ASIC), etc.), or another suitable processor.

In one embodiment, the memory regions 111, 113, . . . , 119 can include any combination of different types of volatile memory components. In some embodiments, the memory regions can be, but are not limited to, random access memory (RAM), dynamic random access memory (DRAM), and synchronous dynamic random access memory (SDRAM). Furthermore, the memory cells of the memory regions can be grouped as memory pages or data blocks that can refer to a unit used to store data.

In one embodiment using parallel access component 107, one or more controllers of the memory system 105 can communicate with the memory regions 111, 113, . . . , 119 to perform operations such as reading data, writing data, or erasing data. Each controller can include hardware such as one or more integrated circuits and/or discrete components, a buffer memory, or a combination thereof. Each controller can be a microcontroller, special purpose logic circuitry (e.g., a field programmable gate array (FPGA), an application specific integrated circuit (ASIC), etc.), or another suitable processor. The controller(s) can include a processing device (processor) configured to execute instructions stored in local memory. In one example, local memory of the controller includes an embedded memory configured to store instructions for performing various processes, operations, logic flows, and routines that control operation of the memory system 105, including handling communications between the memory system 105 and the host system 101. In some embodiments, the local memory can include memory registers storing memory pointers, fetched data, etc. The local memory can also include read-only memory (ROM) for storing micro-code.

In general, controller(s) of memory system 105 can receive commands or operations from the host system 101 and/or processing device 111 and can convert the commands or operations into instructions or appropriate commands to achieve the parallel access to the memory regions for supporting machine learning processing. The controller can be responsible for other operations such as wear leveling operations, garbage collection operations, error detection and error-correcting code (ECC) operations, encryption operations, caching operations, and address translations between a logical block address and a physical block address that are associated with the memory regions. The controller can further include host interface circuitry to communicate with the host system 101 via the physical host interface. The host interface circuitry can convert the commands received from the host system into command instructions to access one or more of the memory regions as well as convert responses associated with the memory regions into information for the host system 101.

The memory system 105 can also include additional circuitry or components that are not illustrated. In some embodiments, the memory system 105 can include a cache or buffer (e.g., DRAM or SRAM) and address circuitry (e.g., a row decoder and a column decoder) that can receive an address from one or more controllers and decode the address to access the memory regions.

In some embodiments, a controller in the host system 101 or memory system 105, and/or the processing device 111 includes at least a portion of the parallel access component 107. For example, the controller and/or the processing device 111 can include logic circuitry implementing the parallel access component 107. For example, a processing device (processor) can be configured to execute instructions stored in memory for performing operations that provide read/write access to memory banks for the parallel access component 107 as described herein. In some embodiments, the parallel access component 107 is part of an operating system, a device driver, or an application.

Figure 2:
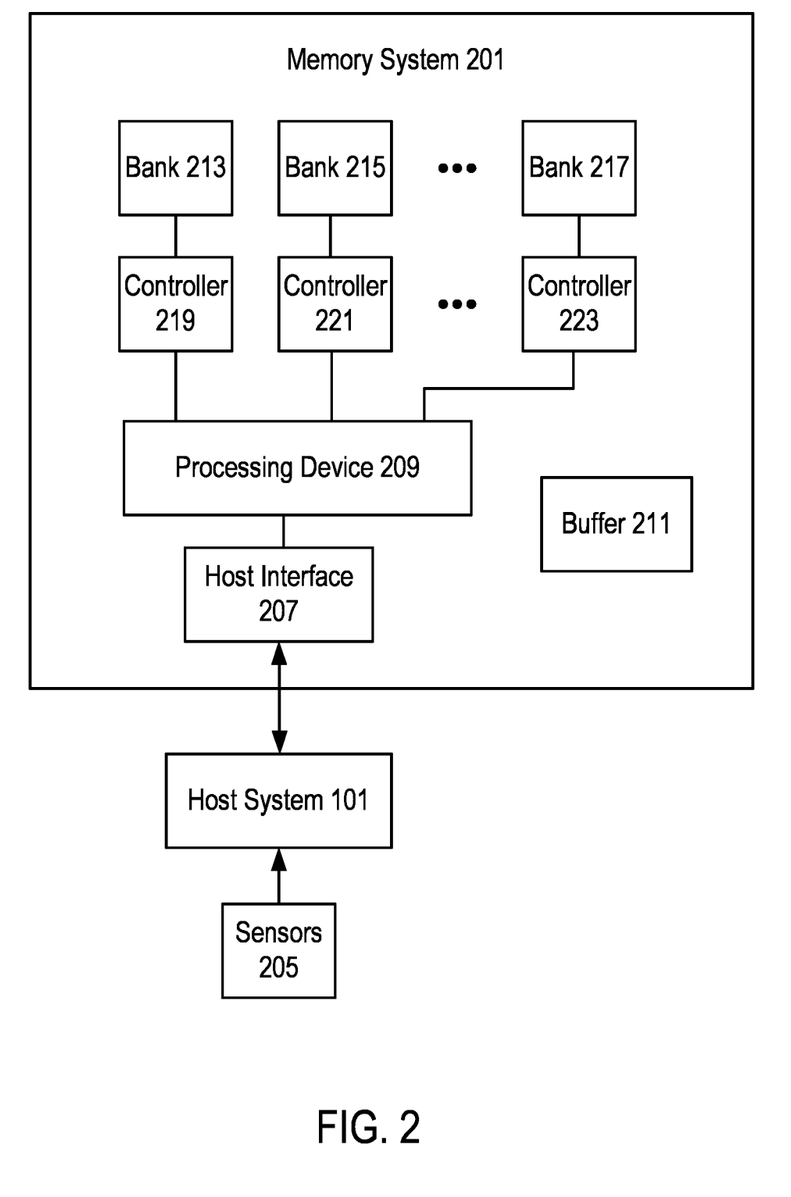
FIG. 2 illustrates an example memory system having banks of memory accessed in parallel by a processing device, in accordance with some embodiments of the present disclosure.

FIG. 2 illustrates an example memory system 201 having banks 213, 215, . . . , 217 of memory accessed in parallel by a processing device 209, in accordance with some embodiments of the present disclosure. Banks 213, 215, . . . , 217 are examples of memory regions 111, 113, . . . , 119. Processing device 209 is an example of processing device 111.

In one embodiment, parallel access component 107 includes controllers 219, 221, . . . , 223 each independently connected to one of banks 213, 215, . . . , 217. Host interface 207 couples processing device 209 to host system 101.

In one embodiment, host system 101 collects data from sensors 205. For example, the sensors 205 are located on an autonomous vehicle and collect image data used for navigation of the vehicle. In one embodiment, the sensor data is input to a neural network and an output is used to control the vehicle. In one embodiment, the processing associated with a neural network is performed by processing device 209, either alone or in conjunction with a processing device of host system 101.

In one embodiment, the neural network is trained or operated using processing device 209. During training or other operation of the neural network, data is read and written to and from the banks 213, 215, . . . , 217. Each bank is operated in either a read or a write mode in order to increase efficiency and reduce memory bus turnaround time. One or more banks can be operated in a continuous burst mode during the training or other operation.

In one embodiment, memory system 201 includes a buffer 211. For example, buffer 211 can receive sensor data received from host system 101 via host interface 207. Data from buffer 211 can be written to one or more of the banks 213, 215, . . . , 217.

In one embodiment, input data for a computer model is read from bank 213 using controller 219. The processing device 209 provides output data from the computer model (e.g., a neural network). The output data is written to bank 215 using controller 221. The output data is structured as stored in bank 215 so that the output data can be accessed sequentially when subsequently read from bank 215 by the processing device 209 for use by the computer model.

In one embodiment, memory system 201 includes processing device 209; a plurality of memory regions (e.g., banks 213, 215, . . . , 217) configured to store data used by the processing device; and at least one controller (e.g., controllers 219, 221, . . . , 223) coupled to the plurality of memory regions and configured to: read data from a first memory region of the plurality of memory regions, including reading first data from the first memory region, the first data for use by the processing device in processing associated with machine learning; and write data to a second memory region of the plurality of memory regions, including writing second data to the second memory region; where reading the first data and writing the second data are performed in parallel. In one embodiment, the at least one controller includes a respective controller used for only read or write access to each of the memory regions.

In one embodiment, the first memory region is used in a continuous burst mode when the first data is read. In one embodiment, the second memory region is used in a continuous burst mode when the second data is written.

In one embodiment, the first data is used as an input to a neural network; the second data is an output from the neural network; and during the processing associated with machine learning, the first memory region operates in a read-only mode, and the second memory region operates in a write-only mode.

In one embodiment, each of the plurality of memory regions is a bank in a volatile memory. In one embodiment, the volatile memory is a dynamic random access memory.

In one embodiment, the processing device, the plurality of memory regions, and the at least one controller are disposed on the same chip or die, and the processing device uses the first data as an input to a computer model for machine learning. In one embodiment, the computer model is a neural network. In one embodiment, the processing device provides the second data as an output from the computer model.

In one embodiment, each controller 219, 221, . . . , 223 can include hardware such as one or more integrated circuits and/or discrete components, a buffer memory, or a combination thereof. The controller can be a microcontroller, special purpose logic circuitry (e.g., a field programmable gate array (FPGA), an application specific integrated circuit (ASIC), etc.), or another suitable processor. The controller can include one or more processors (processing devices) configured to execute instructions stored in local memory.

Local memory of the controller can include an embedded memory configured to store instructions for performing various processes, operations, logic flows, and routines that control aspects of operation for the memory system. Local memory of the controller can include read-only memory (ROM) for storing micro-code and/or memory registers storing, e.g., memory pointers, fetched data, etc.

Figure 3:
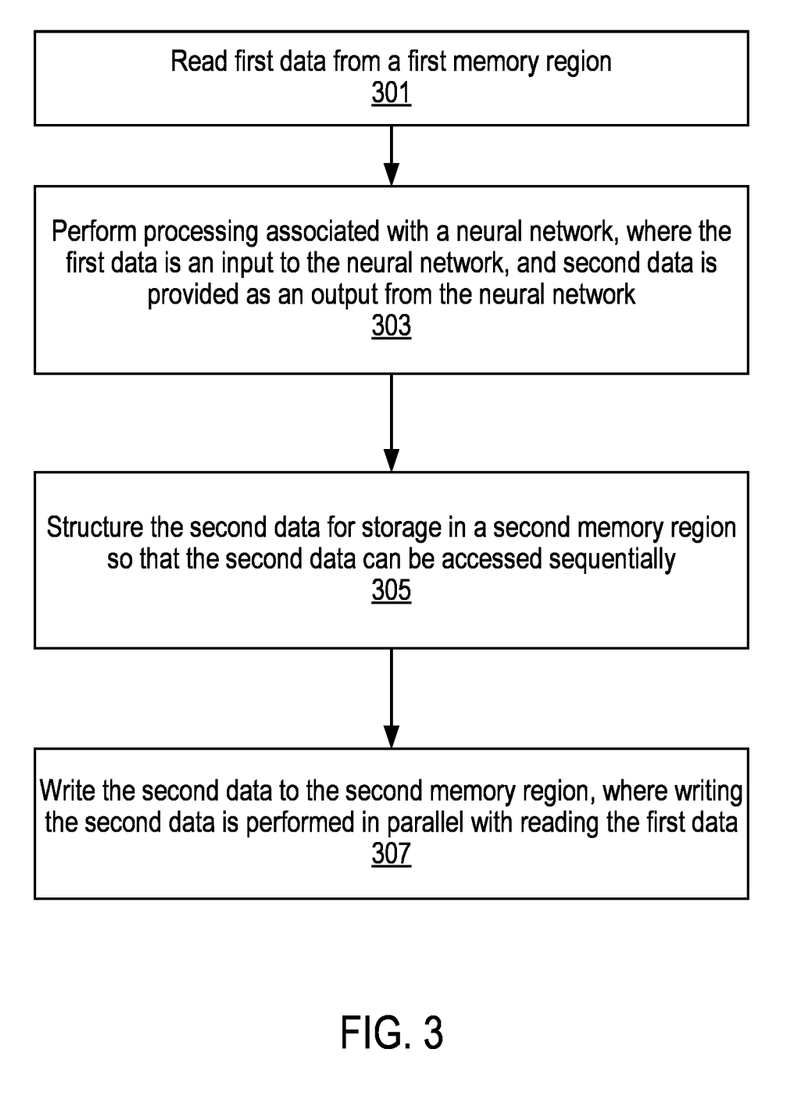
FIG. 3 is a flow diagram of an example method for parallel access to volatile memory for machine learning processing by a processing device, in accordance with some embodiments of the present disclosure.

FIG. 3 is a flow diagram of an example method for parallel access to volatile memory for machine learning processing by a processing device, in accordance with some embodiments of the present disclosure. Examples of the processing device include processing devices 111 and 209. For example, the method of FIG. 3 can be implemented in the system of FIG. 1 or FIG. 2.

The method of FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 3 is performed at least in part by the parallel access component 107 of FIG. 1.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 301, first data is read from a first memory region. For example, the first data is read by processing device 209 from bank 213 using controller 219. In one example, the first data corresponds to inputs used to train a neural network.

At block 303, processing associated with a neural network is performed. The first data is an input to the neural network. Second data is provided as an output from the neural network. For example, the neural network is trained by processing device 209. For example, the first data is sensor data received from sensors 205.

At block 305, the second data is structured for storage in a second memory region so that the second data can be accessed sequentially. For example, the second data is structured for sequential access so that efficiency of processing associated with a neural network can be increased. For example, sequential access of data improves data transfer bandwidth between processing device 209 and banks 213, 215, ..., 217.

At block 307, the second data is written to the second memory region. Writing of the second data is performed in parallel with reading of the first data. For example, the second data is stored by processing device 209 in bank 215 using controller 221. In one example, this parallel writing and reading can be done due to the use of an independent controller for each of the memory banks of memory system 201. In one embodiment, bank 213 and bank 215 are being operated in a continuous burst mode when the first data is read and the second data is written.

In one aspect, the present disclosure includes computing apparatuses performing any of the methods and non-transitory computer-readable storage media storing instructions that, when executed by a processing device, cause the processing device to perform any of the methods.

In one embodiment, a method includes: reading, by a first controller and in response to a request from a processing device, first data from a first memory region of a plurality of memory regions; performing, by the processing device, processing associated with a neural network, where the first data is an input to the neural network, and second data is provided as an output from the neural network; structuring, by the processing device, the second data for storage in a second memory region of the plurality of memory regions so that the second data can be accessed sequentially for use by the neural network when subsequently read from the second memory region; and writing, by a second controller, the second data to the second memory region, where writing the second data is performed in parallel with reading the first data.

In one embodiment, the method further includes reading, by the second controller, the second data from the second memory region, where the second data is accessed sequentially from the second memory region for use as an input to the neural network.

In one embodiment, the method further includes reading, by a third controller, third data from a third memory region of the plurality of memory regions, where reading the second data and reading the third data are performed in parallel, and where the third data is used as an input to the neural network.

In one embodiment, the processing associated with the neural network includes training the neural network using data stored in the first memory region.

In one embodiment, the method further includes: receiving, by the processing device, data from a sensor; where the processing associated with the neural network includes using the data from the sensor as an input to the neural network.

In one embodiment, the method further includes determining, by the processing device, a type of the neural network, where structuring the second data for storage in the second memory region is based on the determined type.

In one embodiment, the first memory region is used in a continuous burst mode when reading the first data, and the second memory region is used in a continuous burst mode when writing the second data.

In one embodiment, during the processing associated with the neural network, the first memory region operates in a read-only mode, and the second memory region operates in a write-only mode.

In one embodiment, a non-transitory computer-readable storage medium stores instructions that, when executed by a processing device, cause the processing device to perform a method, the method including: reading first data from a first bank of a dynamic random access memory; performing processing associated with a neural network, where the first data is an input to the neural network, and second data is provided as an output by the neural network; and writing the second data to a second bank of the dynamic random access memory, where writing the second data is performed in parallel with reading the first data.

Figure 4:
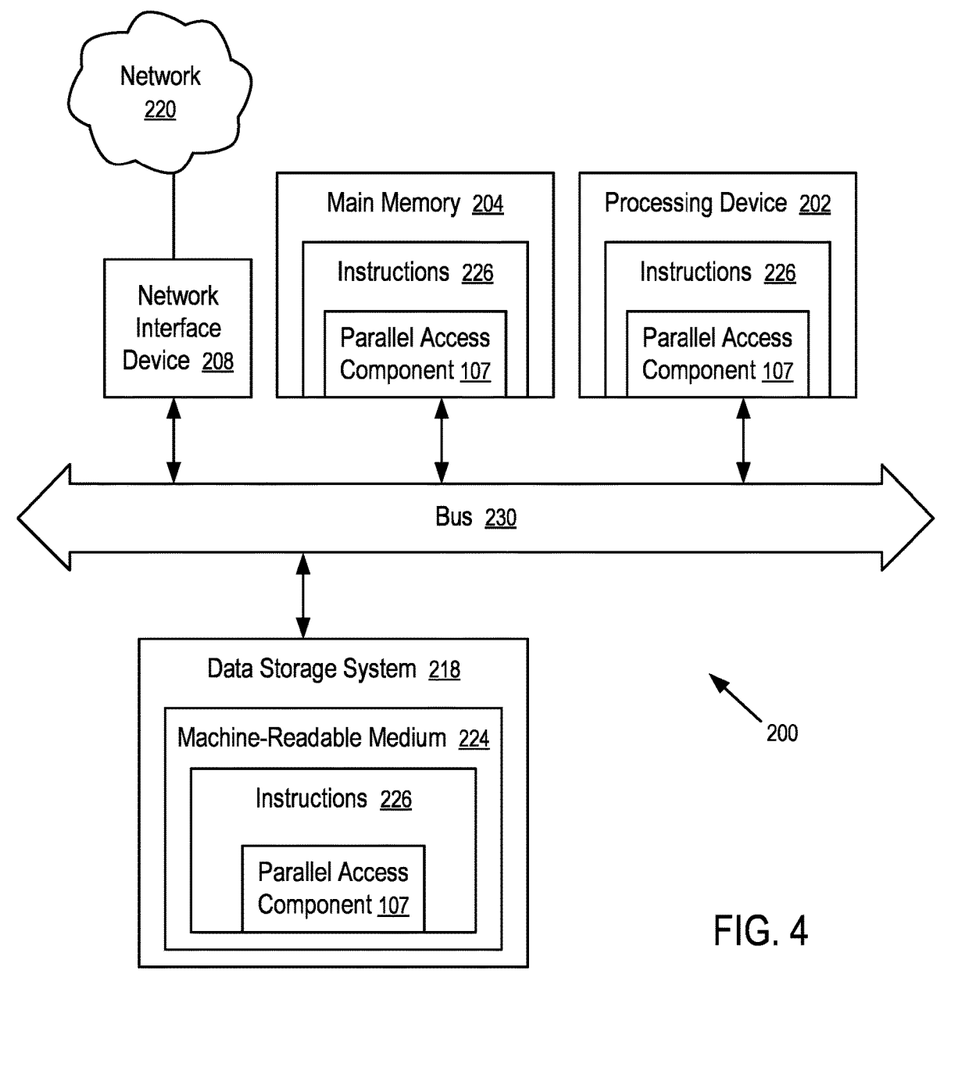
FIG. 4 is a block diagram of an example computer system in which embodiments of the present disclosure can operate.

FIG. 4 is a block diagram of an example computer system 200 in which embodiments of the present disclosure can operate. In one embodiment, in computer system 200 a set of instructions, for causing a machine to perform any one or more of the methodologies discussed herein, can be executed. In some embodiments, the computer system 200 can correspond to a dynamic memory system, or to a host system that includes, is coupled to, or utilizes a dynamic memory system (e.g., the dynamic memory system 105 of FIG. 1) or can be used to perform the operations of a parallel access component 107 (e.g., to execute instructions to perform operations corresponding to the parallel access component 107 described with reference to FIGS. 1-3). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 200 includes a processing device 202, a main memory 204 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 218, which communicate with each other via a bus 230 (which can include multiple buses).

Processing device 202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 202 can also be one or more special-purpose processing devices such as an application specific integrated circuit (ASIC), a field programmable gate array (FPGA), a digital signal processor (DSP), network processor, or the like. The processing device 202 is configured to execute instructions 226 for performing the operations and steps discussed herein. The computer system 200 can further include a network interface device 208 to communicate over the network 220.

The data storage system 218 can include a machine-readable storage medium 224 (also known as a computer-readable medium) on which is stored one or more sets of instructions 226 or software embodying any one or more of the methodologies or functions described herein. The instructions 226 can also reside, completely or at least partially, within the main memory 204 and/or within the processing device 202 during execution thereof by the computer system 200, the main memory 204 and the processing device 202 also constituting machine-readable storage media. The machine-readable storage medium 224, data storage system 218, and/or main memory 204 can correspond to the memory system 105 of FIG. 1.

In one embodiment, the instructions 226 include instructions to implement functionality corresponding to a parallel access component 107 (e.g., the parallel access component 107 described with reference to FIGS. 1-3). While the machine-readable storage medium 224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a plurality of memory regions configured to store data; and
a neural network configured to provide an output based on input from data stored in the memory regions;
at least one processing device coupled to the plurality of memory regions and configured to:
train the neural network using data stored in at least one of the memory regions;
read first data from a first memory region of the plurality of memory regions, wherein the first data is used as an input to the neural network; and
write second data, received as the output from the neural network to a second memory region of the plurality of memory regions, wherein writing the second data is performed in parallel with reading the first data.

2. The system of claim 1, wherein the processing device is further configured to determine a type of the neural network, and to structure the second data written to the second memory region based on the determined type.

3. The system of claim 1, wherein the neural network uses third data from a third memory region as an input.

4. The system of claim 1, wherein the processing device is further configured to read the second data from the second memory region for use as an input to the neural network.

5. The system of claim 1, wherein each of the memory regions is configured for parallel reading or writing for neural network processing while reading or writing the other memory regions.

6. The system of claim 5, wherein the reading or writing of each memory region is independently controlled from the reading or writing of the other memory regions.

7. An apparatus comprising:
a host interface configured to receive commands and sensor data from a host, the commands including a first command;
a processing device configured to convert the commands into operations for access to memory and store the sensor data in a first memory;
addressing circuitry configured to decode addresses received from the host via the host interface for accessing the memory in accordance with the commands;
a first controller configured to, in response to the first command, read first data from the first memory, wherein the first memory operates in a read-only mode and the first data includes the sensor data; and
a second controller configured to write second data to a second memory, wherein the second memory operates in a write-only mode.

8. The apparatus of claim 7, wherein the processing device is further configured to structure the second data for storage in the second memory so that the second data can be accessed for use in future computations.

9. The apparatus of claim 7, further comprising a third controller configured to read third data from a third memory, wherein the second controller is further configured to read the second data from the second memory, and the third data and read second data are used in processing by the processing device.

10. The apparatus of claim 7, wherein the first and second controllers and the first and second memory are disposed on the same chip or die.

11. The apparatus of claim 7, wherein the second controller is further configured to read the second data from the second memory for use as an input to processing by the processing device.

12. The apparatus of claim 7, wherein the second controller is further configured to write the second data to a third memory.

13. The apparatus of claim 7, wherein the sensor data is obtained from at least one sensor located at the host.

14. The apparatus of claim 13, wherein the first controller is further configured to write the sensor data to the first memory.

15. A method comprising:
reading data from a first bank of dynamic random access memory (DRAM), wherein the first bank is used in a continuous burst mode when the data is read;
providing the read data as an input for processing by a processor; and
writing data, received as output from the processing by the processor, to a second bank of the DRAM, wherein the second bank is used in a continuous burst mode when the data is written.

16. The method of claim 15, wherein the data read from the first bank is accessed sequentially for use in the processing.

17. The method of claim 15, wherein the first bank is configured to operate in a read-only mode, and the second bank is configured to operate in a write-only mode.

18. The method of claim 15, further comprising structuring the second data for storage in the second bank so that the second data can be accessed sequentially by the processor.

19. The method of claim 15, further comprising temporarily storing at least one result from the processing in a buffer prior to writing the result to a third bank of the DRAM.

20. The method of claim 15, wherein each memory bank of the DRAM is coupled to a dedicated controller for reading or writing.

* * * * *